United States Patent
Hochstenbach

(10) Patent No.: US 8,338,967 B2
(45) Date of Patent: Dec. 25, 2012

(54) STRESS BUFFERING PACKAGE FOR A SEMICONDUCTOR COMPONENT

(75) Inventor: Hendrik P. Hochstenbach, Nijmegen (NL)

(73) Assignee: NXP B.V., Eindhoven (NL)

( * ) Notice: Subject to any disclaimer, the term of this patent is extended or adjusted under 35 U.S.C. 154(b) by 824 days.

(21) Appl. No.: 12/161,511

(22) PCT Filed: Jan. 18, 2007

(86) PCT No.: PCT/IB2007/050174
§ 371 (c)(1),
(2), (4) Date: Jul. 18, 2008

(87) PCT Pub. No.: WO2007/085988
PCT Pub. Date: Aug. 2, 2007

(65) Prior Publication Data
US 2010/0224987 A1 Sep. 9, 2010

(30) Foreign Application Priority Data

Jan. 24, 2006 (EP) .................................. 06100793

(51) Int. Cl.
*H01L 23/48* (2006.01)
*H01L 23/52* (2006.01)
*H01L 29/40* (2006.01)

(52) U.S. Cl. ........ 257/780; 257/786; 257/778; 438/108; 438/613

(58) Field of Classification Search .............. 257/780, 257/781, 786, 778; 438/108, 613, 614
See application file for complete search history.

(56) References Cited

U.S. PATENT DOCUMENTS

| | | | |
|---|---|---|---|
| 6,396,156 B1 | 5/2002 | Tang et al. | |
| 6,768,210 B2 * | 7/2004 | Zuniga-Ortiz et al. | 257/781 |
| 7,095,121 B2 * | 8/2006 | Tellkamp | 257/781 |
| 2002/0000671 A1 * | 1/2002 | Zuniga et al. | 257/773 |
| 2003/0089969 A1 | 5/2003 | Hashimoto | |
| 2003/0173682 A1 * | 9/2003 | Bendal | 257/780 |
| 2003/0222352 A1 * | 12/2003 | Kung et al. | 257/772 |
| 2004/0018660 A1 | 1/2004 | Kim et al. | |
| 2004/0082101 A1 * | 4/2004 | Honda | 438/106 |
| 2005/0151268 A1 * | 7/2005 | Boyd et al. | 257/778 |

FOREIGN PATENT DOCUMENTS

| | | |
|---|---|---|
| EP | 0064854 A1 | 11/1982 |
| GB | 2135525 A | 8/1984 |
| JP | 49112570 A1 | 10/1974 |
| JP | 52150966 A | 12/1977 |
| JP | 05-013418 | 1/1993 |
| JP | 05013418 A | 1/1993 |
| JP | 9036120 A | 2/1997 |
| JP | 11266499 A | 9/1999 |
| WO | 2005115679 A1 | 12/2005 |

* cited by examiner

*Primary Examiner* — S. V. Clark

(57) ABSTRACT

The present invention relates to a stress buffering package for a semiconductor component, wherein a stress buffering means comprises individual stress buffering elements that do not influence the stress buffering effect from each other. Furthermore the invention relates a method for manufacturing a stress buffering package for a semiconductor component.

22 Claims, 2 Drawing Sheets

STRESS BUFFERING PACKAGE FOR A SEMICONDUCTOR COMPONENT

The present invention relates to a stress buffering package for a semiconductor component according to the preamble of claim 1. So-termed chip scale packages are concerned here. An electrical element, which may, for example, comprise a diode, a transistor, a MEMS (Micro-Electro-Mechanical Element) or a capacitor, is fixed to a substrate, such as a printed circuit board, by means of solder balls without using an additional carrier. A chip scale package is used inter alia for so-termed power transistors and for ESD diodes, usually in combination with a passive filter comprising resistors, capacitors and/or coils. Chip scale packages are furthermore used in particular for FM radio. This is a semiconductor with an amplifier and a tuner and any circuits that may further be required, which is capable of performing a radio function in a mobile telephone in its entirety. Partially because of the small amount of space that is available in a mobile telephone, the size of the package is of the essence in this case.

Generally, the solder balls of a chip scale package are mounted directly on a motherboard or printed circuit board provided with electrodes corresponding to the solder balls. The solder balls are soldered onto the board to obtain an electronic device. During said soldering and during use of the device, stresses will occur as a result of the differences in thermal expansion between the material of the board and, for example, the silicon of a semiconductor. Said stresses occur in particular in the solder balls and at the interface of the solder balls and the underlying structure. If no measures are taken, this will lead to an insufficient degree of reliability of the electronic device, in particular during thermal cycles and fall tests. This has led to the provision of stress buffering packages as described in the preceding paragraphs, in which a stress buffering means for absorbing stresses is provided between the I/O pads and the solder balls.

US patent document US2004/0082101 discusses a chip scale package that makes use of an insulating stress absorbing resin layer. The associated package 10 is shown in FIG. 1. The stress absorbing resin layer 12, which is made of a thermosetting resin such as epoxy resin or polyimide resin, has a modulus of elasticity of 0.01-8 Gpa and is relatively flexible, therefore. After the resin layer has been coated on the passivation layer 14, holes are etched so as to expose the so-termed I/O pads. Then the holes are filled with a flexible conductive layer 18. The conductive layer comprises a powdery material of at least one of copper, lead, tin, nickel, palladium, silver or gold. Finally, solder balls 20 are placed on the conductive layer 18. The stress absorbing layer 12 and the conductive layer 18 jointly form a stress buffering means 22. The layer 12 is made of an elastic material having a thermal expansion coefficient of 40-600 ppm/K. For all the embodiments that are shown in US2004/0082101 it obtains that the stress buffering means 22 is uninterrupted, at least from a thermomechanical point of view. Because both the stress absorbing layer 12 and the conductive layer 18 are flexible, stress occurring in one solder balls can be transmitted to adjacent solder balls via the stress buffering means 22.

The method as discussed in US2004/0082101 comprises a number of difficult and costly steps such as lithography, etching, plasma surface treatments, screen printing, etc. In addition, the conductive layer 18 comprises materials which present problems when manufacturing semiconductors, in particular in the waferfab. The use of materials such as copper or gold may lead to the electronic circuits in the silicon being affected.

Another known solution is presented in FIG. 2, which shows a package 30 in which a stress absorbing layer 32 of polyimide is provided on top of a passivation layer 34. An opening is present in the layer 32, which opening at least partially coincides, seen in projection, with the opening in the passivation layer. An underbump metallization 36 (UBM) is present partially on the stress absorbing layer 32 and partially in the opening (for contact with the I/O pads 40). The UBM thus has the shape of an upside-down cowboy hat. The UBM does not fill the openings in the passivation layer and the buffer layer completely, so that a hollow is formed. As a result, the solder balls 38 are partially present in said hollow. In this solution, too, a stress buffering means comprising the stress absorbing layer 32 and the UBM layers is thermomechanically uninterrupted. The fact of the matter is that the UBM layer is a hard layer, certainly in comparison with the material of the stress absorbing layer and the solder balls, which hard layer generally comprises nickel and which will transmit the stresses that occur to the adjacent UBM structures via the surrounding polyimide layer.

Varying phases of heating and cooling occur during the so-termed thermal cycling. This is discussed, for example, in patent documents GB 2,135,525 and EP 0 064 854. It is also known for BGA packages. It is a generally known fact that the largest problems with thermal cycling normally occur at the solder balls furthest away from the center of the package (i.e. the center of the semiconductor, also referred to as the neutral point). After all, in thermal cycling the board expands more than the semiconductor. The left-hand edge of the semiconductor is pulled to the left and the right-hand edge is pulled to the right relative to the center of the semiconductor upon heating, therefore. The difference in movement between the semiconductor and the board is much larger at the edge of the semiconductor than somewhere in the center.

The object of the present invention is to provide a reliable package for a semiconductor comprising a stress buffer.

This object is achieved by providing a package which is characterized in that the stress buffering means comprises individual stress buffering elements, in which each stress buffering element substantially absorbs stresses that are set up in a group comprising at least one solder ball, so that the absorption of stresses by a stress buffering element does not influence the stress buffering effect of the other stress buffering elements.

The primary perception underlying the invention is that the degree of reliability is enhanced by splitting up the stress buffering means into smaller individual elements, in particular by providing a separate stress buffering element for each solder ball. Each stress buffering element absorbs at least a significant part of the stresses that are set up in the solder balls and in the underlying structures as a result of the differences in thermal expansion between the electrical element and an associated board, preventing premature fracturing and dysfunctioning of the electronic connections in the package.

This improved reliability is only obtained if the stress buffering elements are not connected, which is effected by providing the passivation layer. This means, among other things, that preferably the upper side and the sides, at least part of the sides, of the stress buffering elements do not have an interface with the passivation layer.

The separate (from a thermomechanical point of view) stress buffering elements provide at least two additional mechanisms for stress relaxation and deformation that the prior art does not provide.

As already noted before, the difference in movement between the semiconductor and a board is larger at the edge of the semiconductor than somewhere in the center. The amount of stress in one solder ball is greater than in another solder ball, therefore. When the stress buffering means is not split up and is thermomechanically uninterrupted, it is conceivable that stresses generated by one solder ball are transmitted to an adjacent solder ball, in which case the stresses may accumulate at an unpredictable location, such that cracks are locally formed. This may take place at the interface between a solder ball and an associated connecting structure, for example. The stresses that occur in adjacent solder balls may be transmitted to a solder ball positioned therebetween, for example, in such a way that said stresses will intensify each other. The solution according to the present invention prevents the occurrence of such a concentration of stresses.

The combination of a stress buffering element and a solder ball may be regarded as two series-connected springs. Said springs are capable of adjusting themselves optimally in dependence on the specific thermal cycling situation, thus providing a second advantageous mechanism. Said adjustment may differ with every connection from substrate to semiconductor, i.e. for every combination of a solder ball and a stress buffering element.

The fact that the stress buffering elements are thermomechanically independent of adjacent stress buffering elements in itself renders the solution according to the present invention different from the prior art solutions.

A further relevant aspect is the fact that the structure according to the invention does not appear to be suitable for use in combination with redistribution in the stress buffering means. Such a redistribution track would be connected to the passivation layer and, combined with a connection to the substrate, would thus lead to failure of the connection between the redistribution track and a bump pad accommodating a solder ball.

The invention further relates to a stress buffering package for a semiconductor component according to claim 6, and to a stress buffering package for a semiconductor component suitable for placing solder balls according to claim 7. The invention moreover relates to an assembly comprising a substrate and a stress buffering package, stress buffering elements, an audio circuit comprising a stress buffering package and a method for manufacturing a stress buffering package for a semiconductor component.

As already indicated, it is advantageous if an individual and thermomechanically separate stress buffering element be provided for each I/O pad. It is not excluded, however, to use one stress buffering element for a group comprising several solder balls arranged adjacently to each other, or to interconnect the stress buffering elements for a number of solder balls by means of a further connection layer. This obtains in particular for the solder balls located near the center line of the semiconductor. This connection and fixation of a number of thermomechanically fairly uncomplicated solder balls moreover appears to make it possible to carry out a redistribution anyway.

Preferably, stress buffering elements of an electrically conductive material are used, in which in fact the function of electrically connecting the solder balls to the I/O pads is combined with the function of absorbing the stresses that occur. Since the stress buffering elements are individual, patterned elements, this does not present any short-circuiting problems.

The stress buffering means and the solder ball are preferably selected so that they have a comparable elasticity, plasticity and thermal expansion coefficient. For the Young's modulus it is advantageous if both have a modulus of 10-100 GPa, more advantageously 20-80 GPa and even more advantageously 25-75 GPa. A similar effect obtains for the plasticity value: an advantageous value for both is a plasticity limit of 20-250 MPa, it is even more advantageous if this range of values is less wide. Good results have been achieved with a combination of stress buffering elements of an aluminum alloy (E-modulus 60 GPA, plasticity limit 200 MPa) and so-termed SAC solder (tin-silver-copper solder having an E-modulus of 32 GPa and a plasticity limit of 20 MPa), which both have a thermal expansion coefficient of 20-25 ppm/K.

The stress buffering elements are preferably coated with a bonding material for solder, such as nickel. Preferably, the nickel has a sufficient thickness, especially in combination with the use of a high-tin solder, such as SAC. The fact is that this solder tends to slowly dissolve the Ni. Once the Ni layer has been completely consumed, the solder ball will no longer bond and the life of the connection has come to an end. Advantageous results have been achieved with Ni-layers having a thickness of at least 0.4 µm, more preferably 0.8 µm and even more preferably even thicker. It is noted in this connection that both the stiffness and the elasticity limit of Nickel is much higher than that of aluminum (alloys) and solder. Nickle, for example, has an E-modulus of 161 GPa.

Said Ni-layers are usually doped with a retarding agent, which prevents Nickel from dissolving. It is possible to use 8% Vanadium in the Ni for this purpose. Preferably, 5-10% phosphorous is added in the case of NiAu electrodes. The required thickness of the layer of bonding material depends on the diameter of the solder ball and the specific type of folder, of course, and also on the conditions to which an electronic device is exposed during use.

It is very advantageous to apply the bonding layer in such a manner that it is present not only on the upper side but also on the sides of each stress buffering element, at least on that part of the side that does not have an interface with the underlying passivation layer. The visible result is that the solder can also extend on said side. Probably this leads to a different angle of contract between the solder and the underlying surface than in the case in which the bonding layer is only present on the upper side of a stress buffering element. Such a different, probably more advantageous angle of contract may have a positive effect on the deformation of the solder ball in a lateral direction, i.e. parallel to the substrate.

It will be understood, however, that coating the entire stress buffering means with bonding material also leads to an increased resistance of the elements against corrosion. Corrosion problems frequently occur in particular with Al. The seal obtained with the bonding material (and also with the solder, therefore) provides an excellent resistance against moisture and all kinds of other environmental factors to which a surface is exposed during further assembly, for example during the cleaning steps, and during use.

An advantageous manner of applying the bonding material both to the upper side and to the sides is by means of an electroless plating technique, as known per se to those skilled in the art. On the other hand, when a sputtering technique is used for applying the Ni, the Ni is only applied to the upper side of the stress buffering elements.

It has become apparent that when aluminum stress buffering elements are used, a minimum and a maximum thickness are to be maintained. When the Al-layer is too thick, the buffering layer will be too soft and will tear. When the Al-layer is too thin, the layer will be too stiff and will likewise tear. A suitable range is a thickness of 1-5 µm. For the sake of clarity it is mentioned that the term "thickness" as used herein is understood to refer to the thickness of the parts of the stress buffering elements that extend from the upper side of the passivation layer. It will be apparent to those skilled in the art that said minimum and maximum values depend on the material that is used. Alloys of Al, such as Al—Mg, are generally stiffer, for example, and require much greater thicknesses. It is not excluded that the stress buffering elements comprise several sublayers, possibly of different materials.

In view of the relation between the required expansion or deformation and the distance to the center line of the semiconductor, and consequently also between the stress load and the distance to the center line of the semiconductor, the enhanced reliability can be enhanced even further by having the stiffness of a stress buffering element decrease as the distance to the center line of the semiconductor decreases. This so-termed on-chip variation can only be used within bounds, of course. Such a variant may provide a solution for chip size packages having a larger matrix than that of 7*7 and/or larger semiconductor surfaces.

As already indicated before, redistribution is not always possible when using electrically conductive and thermomechanically separate stress buffering elements. Apart from the solution that has been explained in the foregoing, there is another possibility which is in fact even simpler: it is possible to use a stress buffering element for redistribution if said stress buffering element is not mechanically connected to the opposite substrate or board. This means that the ends of such a redistribution part must be led back to the metallization under the passivation layer via openings therein.

In addition to its use for redistribution (interconnect), this possibility is also very suitable for definition of, for example, coils in such a stress buffering element. The thickness of the Al renders this layer very suitable for this purpose.

For the sake of completeness it is furthermore noted that the use of an underbump metallization of nickel results in a mechanically hard plate between the solder ball and the stress buffering elements. It is assumed that the solution according to the invention will also function on the basis of a series-connected spring system (in which case the spring near the semiconductor is capable of deformation, therefore) without such a hard plate.

In particular it is noted that from WO2005/115679 a solder material is known which is capable of bonding to Al without a separate bonding layer being used. This material can be used to advantage in combination with the present invention, of course. Its use may also be advantageous if a bonding layer is used anyway, viz. to provide additional protection.

An important advantage of the stress buffering package according to the invention is that the I/O pads under the passivation layer can have a small diameter without the diameter of the solder balls being reduced proportionally. This will be explained in more detail in the description of the figures. Compared to the present solution, as shown in FIG. 2, a reduction from 120*120 μm to 10*10 μm for every I/O pad seems possible. This is a reduction by a factor of more than ten, therefore.

This reduction moreover makes it possible to reduce the surface area per semiconductor and thus obtain more products from a single wafer or batch. Furthermore, the reduction makes it possible to define active elements under the solder balls in a chip scale package. The large I/O pads as used in the prior art according to the embodiment of FIG. 2, which were necessary in particular because of the weak bond of the polyimide, led to mechanical stresses that could not be combined with active elements present thereunder. The reduction of the I/O pad, which is not combined with a reduction of the solder ball, provides a reduction of this unusable part of the semiconductor. Consequently this solution is very suitable for use in mobile telephony and other portable products.

It is noted that also the diameter of the I/O pads according to the invention will be smaller than that of the I/O pads shown in FIG. 1 of US2004/0082101. To obtain a suitable low resistance of the connection between board and semiconductor by means of the conductive layer 18, the diameter in the opening through the passivation layer will have to be reasonably large. The fact is that the conductive powder will probably be provided in a flexible, non-conductive material so as to obtain the desired flexibility, which increases the overall electrical resistance of the layer 18. The overall electrical resistance will thus be lower than, for example, the electrical resistance of a stress buffering element according to the invention, which comprises aluminum.

The invention will be explained in more detail hereinafter with reference to the appended figures, in which:

FIGS. 1 and 2 shows a package according to the prior art, which has been discussed in the foregoing.

Figure 3:
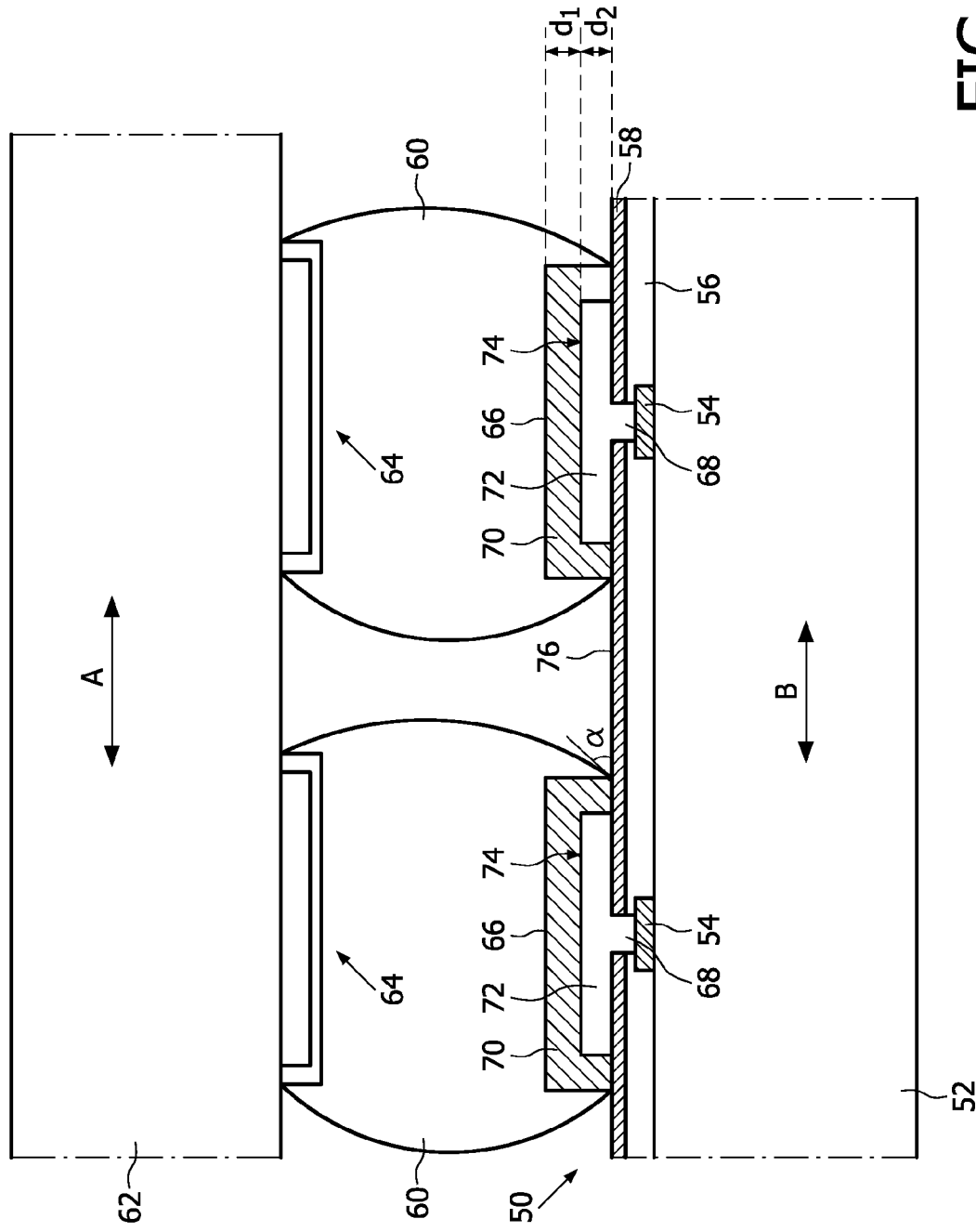
FIG. 3 is a schematic view of a part of a section of a package for a semiconductor according to a preferred embodiment.

FIG. 3 shows a stress-buffering package 50 for a semiconductor 52, which comprises a number of I/O pads 54 on an upper surface thereof. The semiconductor furthermore comprises a passivation layer 56, which protects the active regions of the semiconductor and exposes the I/O pads. The passivation layer preferably comprises silicon oxide. Usually an additional passivation layer 58 of silicon nitride is applied to the passivation layer 56.

Solder balls 60 function to electrically connect the semiconductor 52 or another electrical element to a board 62, which is to that end provided with electrodes 64. The I/O pads and the solder balls are electrically connected by an underbump metallization 70 and a stress buffering element 74. An outer surface of the underbump metallization 70 forms a so-termed bond pad 66, which makes it possible to place the solder ball.

Each stress buffering element 74 is built up of a first part 68, which is provided in an opening in the passivation layers 56 and 58, and a second part 72, which extends from the surface 76 of the passivation layer 58. The first part 68 makes contact with the I/O pad in question, whilst the second part 72 is electrically connected to the solder ball 60 in question via the underbump metallization 70. The dimensions of the first part 68 in directions parallel to the surface 76 are much smaller than the dimensions in the corresponding directions of the second part 72. This is clearly shown in FIG. 3. A major advantage of this aspect is that it is possible to use relatively small I/O pads, at least without there being a need to adapt the diameter of the solder ball. This phenomenon is also referred to as repassivation. It is advantageous in particular because the region under the I/O pads cannot normally be used for active circuits or interconnect structures because of the stresses to which the I/O pad are exposed. When the dimensions of the I/O are reduced, a larger part of the semiconductor can be effectively utilised.

Preferably, each stress buffering element 74 is built up of only one material or one component. It is conceivable, however, for the two parts 68 and 72 to consist of several layers, each layer being geared to the specific properties that are required.

The solder balls 60 form a conductive connection to electrodes 64 of a printed circuit board 62 so as to form an electronic device therewith. It is a well-known fact that the coefficient of thermal expansion of the silicon of the semiconductor 52 is much lower than the coefficient of thermal expansion of the materials that are used for the PCB. This leads to stresses in the package during testing and during further use. In view of the dimensions of the two components, it is especially differences in expansion in the devices A and B shown in FIG. 3 that are relevant in this connection. Furthermore it will be apparent that the difference in expansion will be larger in the solder balls provided at the edge of the semiconductor than in the solder balls that are located in the center of the semiconductor. The problem of thermal stresses plays a much smaller part in the case of the latter solder balls, therefore.

According to the present invention, the aforesaid stresses are neutralized by the stress buffering element 74. The larger portion of the stresses will be absorbed by the parts 72 of the stress buffer. This means that the stresses in one connecting structural/solder ball will not be transmitted to adjacent connecting structures/solder balls. This in contrast to the stress buffering means 22 of FIG. 1 and the stress buffering means 36, 32 of FIG. 2. The connecting structures 18 (FIG. 1) and 36 (FIG. 1), on the other hand, will be able to transmit stresses in this case. The invention thus provides a number of significant advantages, as already described before.

Figure 1:
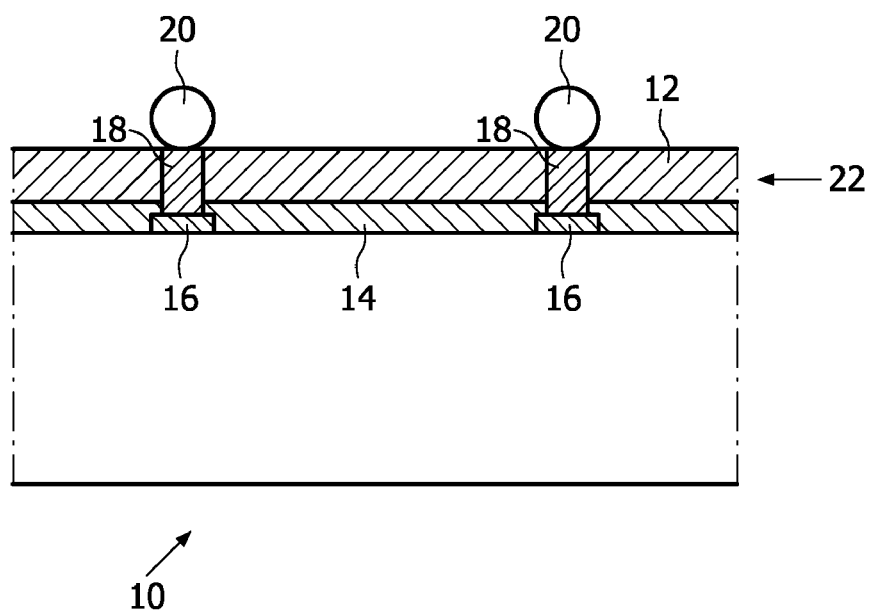
FIGS. 1 and 2 are schematic views of a part of a section of a package for a semiconductor according to the prior art.

As already noted before, the configuration that is shown in FIG. 3 could be modelled as a set of series-connected springs, with the differences in thermal expansion determining the stretch of the springs and the material and the thickness of a layer determining the spring characteristic. In FIG. 3, for example, a relatively stiff spring corresponding to the underbump metallization 70 is in that case connected to two relatively soft springs, which correspond to the stress buffering part 74 of aluminum and the solder balls 60, respectively. Each figure shows only two such spring assemblies, therefore, but it will be apparent that in practice (where a multitude of solder balls are used) a multitude of spring assemblies will be provided side by side in two directions. It is typical of the invention that the stretch and the tensions of the springs in one spring assembly do not influence the stretch and the tensions in the other spring system. In the situation that is shown in FIGS. 1 and 2, a relatively large amount of stretch and tension in one of the springs of the spring assembly can contribute to an increased stretch and tension in adjacent spring assemblies.

Figure 2:
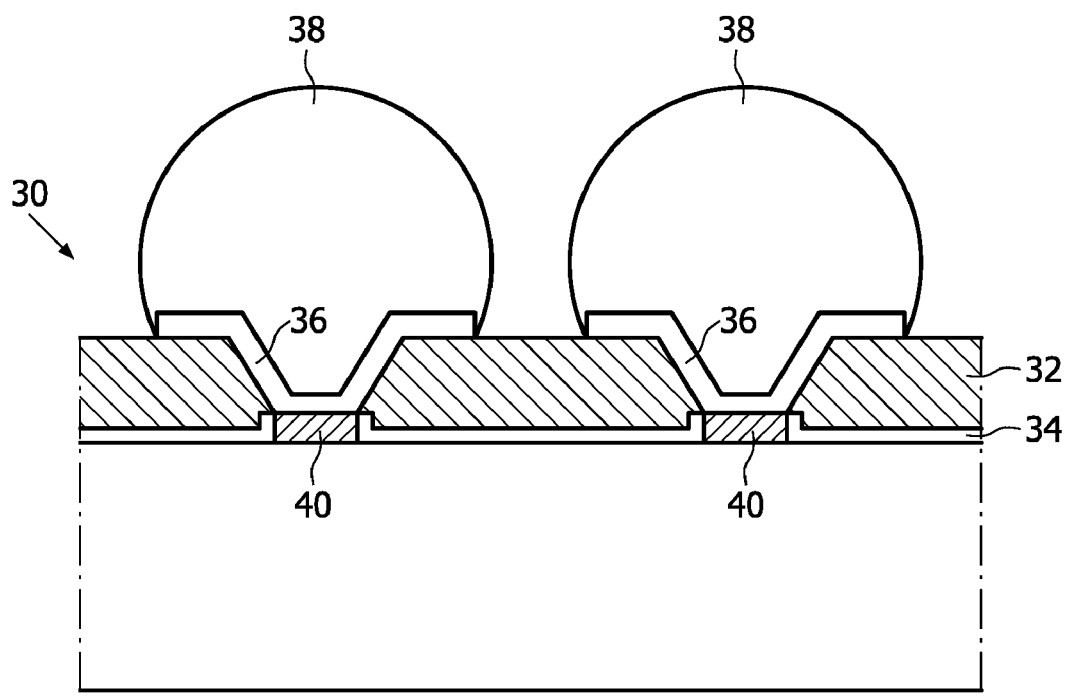

With regard to the known solution as shown in FIG. 2, it is noted that in view of the fact that the underbump metallization 36 is fixed to the bond pad 40 and to the passivation layer 34 only partially determines the deformation and the relative movement of the underbump metallization with respect to the semiconductor by the relative deformation of the stress buffering layer 32. After all, the underbump metallization is fixed to the semiconductor via the I/O pads, and as a result the relative movement and/or the deformation of the hat shape of the underbump metallization is reduced.

The underbump metallization 70 is preferably nickel and has a thickness $d_1$ in the range of 0.5-5 μm. The nickel is preferably applied by means of an electroless plating process. As a result, also the sides of the part 72 of the stress buffer are coated. This is advantageous both with regard to the protection against corrosion of the stress buffer and with regard to obtaining an advantageous angle of contact α of the solder balls 60.

Each stress buffering element 74 preferably consists of an aluminum alloy. Experiments have shown that good results can be obtained by using an aluminum alloy comprising 0.5% copper and a thickness $d_2$ of the part 72 of the stress buffer 74 of 2.5 μm. Preferably, said thickness $d_2$ ranges between 1 and 5 μm.

Preferably, a separate stress buffering element is used for each solder ball, in which case stresses in one solder ball or in the underlying connecting structures are not transmitted to adjacent solder balls and stress buffering elements. As already indicated, it is conceivable, however, to use stress buffering elements that are thermomechanically interconnected for a group of adjacent solder balls, for example by connecting a number of adjacent stress buffering elements 74 via a connection layer provided therebetween (not shown in FIG. 3). In view of the locally lower thermal stresses, this system could be used in particular for the solder balls that are present near the center line of the semiconductor.

Another preference is the fact that the stress buffering elements 74 function best on passivation layers having a smooth surface. If this is not the case, dangerous stress concentrations may build up in the interface between the part 72 of a stress buffering element 74 and the upper passivation layer 58, which may lead to cracks. It is for this reason that so-termed Chemical Mechanical Polishing (CMP) techniques are used in order to obtain a smooth passivation layer 58, possibly in combination with the application of the upper passivation layer by means of the so-termed Spin On Glass (SOG) process.

Although solder balls are used in the illustrated embodiments for electrically connecting the package, it is also possible to use stress buffering elements according to the invention in packages that do not comprise solder balls, for example in more conventional packages comprising wire connections to a leadframe. The advantage of this is that the processes used for providing a stress buffering means can be used for several kinds of packages within a factory.

The invention claimed is:

1. A stress buffering package for a semiconductor component, comprising:
   at least one electrical element;
   I/O pads, which are electrically connected to the element;
   a passivation layer, which protects the electrical element and at least partially exposes the I/O pads, which passivation layer has an upper side that faces away from the electrical element;
   solder balls, which are electrically connected to the I/O pads;
   a stress buffering means for absorbing stresses, which is provided between the I/O pads and the solder balls;
   characterized in that the stress buffering means comprises individual stress buffering elements, in which each stress buffering element substantially absorbs mechanical stresses that are set up in a group comprising at least one solder ball, so that the absorption of stresses by a stress buffering element does not influence a stress buffering effect of the other stress buffering elements.

2. A package as claimed in claim 1, characterized in that each stress buffering element corresponds to a solder ball.

3. A package as claimed in claim 1, characterized in that the stress buffering element comprises electrically conductive material.

4. A package as claimed in claim 3, characterized in that the stress buffering element mainly comprises aluminum.

5. A package as claimed in claim 1, characterized in that each stress buffering element extends from the upper side of the passivation layer.

6. A stress buffering package for a semiconductor component, comprising:
   at least one electrical element with I/O pads;
   a passivation layer, which protects the electrical element and at least partially exposes the I/O pads, which passivation layer has an upper side that faces away from the electrical element;
   solder balls, which are electrically connected to the I/O pads;

a stress buffering means for absorbing mechanical stresses, which is provided between the I/O pads and the solder balls;

characterized in that the stress buffering means comprises individual stress buffering elements, in which each stress buffering element comprises a first part, which is provided in an opening in the passivation layer, and a second part, which extends from the upper side of the passivation layer, wherein the dimensions of the first part in directions parallel to a surface defined by the upper side of the passivation layer are smaller than the dimensions in the corresponding directions of the second part.

7. A stress buffering package for a semiconductor component suitable for placing solder balls, comprising:

at least one electrical element with I/O pads;

a passivation layer, which protects the electrical element and at least partially exposes the I/O pads, which passivation layer has an upper side that faces away from the electrical element;

bond pads for placing solder balls, in which the bond pads are electrically connected to the I/O pads;

a stress buffering means for absorbing mechanical stresses, which is provided between the I/O pads and the bond pads;

characterized in that the stress buffering means comprises individual stress buffering elements, in which each stress buffering element substantially absorbs stresses that are set up in a group comprising at least one bond pad when solder balls are positioned on the bond pads, so that the absorption of stresses by a stress buffering element does not influence the stress buffering effect of the other stress buffering elements.

8. An assembly comprising a substrate and a stress buffering package as claimed in claim 1, which is electrically connected to the substrate via the solder balls.

9. An audio circuit comprising a stress buffering package as claimed in claim 1, wherein said at least one electrical element comprises a circuit for receiving and amplifying an audio signal.

10. A stress buffering device comprising:

a plurality of stress buffering components, each stress buffering component configured and arranged to couple between solder balls and I/O pads electrically connected to an electrical element protected by a passivation layer that has an upper side facing away from the electrical element and at least partially exposes the I/O pads; and absorb mechanical stresses applied via the solder ball, each stress buffering component being spaced from the center of the electrical element, relative to the distance that other ones of the stress buffering elements are spaced from the center of the electrical element, to prevent the stress buffering component from influencing the stress buffering effect of the other stress buffering components.

11. A method of manufacturing a stress buffering package for a semiconductor component, comprising the steps of:

providing at least one electrical element comprising I/O pads and a passivation layer, which protects the electrical element and at least partially exposes the I/O pads, which passivation layer has an upper side that faces away from the electrical element;

providing electrically conductive mechanical stress buffering elements, wherein each element extends into openings in the passivation layer formed above the I/O pads on the one hand and from the upper side of the passivation layer on the other hand.

12. A method as claimed in claim 11, characterized by applying a bonding layer to the stress buffering elements.

13. A method as claimed in claim 12, characterized by the application of said bonding layer to each free side of the stress buffering elements.

14. A package as claimed in claim 1, wherein each stress buffering element is configured to absorb mechanical stress from one of the solder balls, while not influencing a mechanical stress buffering effect of the other stress buffering elements.

15. A package as claimed in claim 1, wherein one of the stress buffering elements, which is closer to a centerline of the package than another one of the stress buffering elements, is configured with a stiffness that is greater than a stiffness of the other one of the stress buffering elements.

16. A package as claimed in claim 1, wherein each stress buffering element is thermomechanically isolated from the other stress buffering elements.

17. A stress buffering package as claimed in claim 6, wherein each stress buffering element is configured to absorb mechanical stress from one of the I/O pads, while not influencing a mechanical stress buffering effect of the other stress buffering elements for other ones of the I/O pads.

18. A stress buffering package as claimed in claim 6, wherein one of the stress buffering elements, which is closer to a centerline of the package than another one of the stress buffering elements, is configured with a stiffness that is greater than a stiffness of the other one of the stress buffering elements.

19. A package as claimed in claim 6, wherein at least one of the stress buffering elements is thermomechanically isolated from the other stress buffering elements.

20. The method of claim 11, wherein providing electrically conductive stress buffering elements includes providing stress buffering elements in which each stress buffering element is configured to absorb mechanical stress from one of the I/O pads, while not influencing a mechanical stress buffering effect of the other stress buffering elements for other ones of the I/O pads.

21. The method of claim 11, wherein providing electrically conductive stress buffering elements includes providing one of the stress buffering elements that is closer to a centerline of the package than another one of the stress buffering elements and that is configured with a stiffness that is greater than a stiffness of the other one of the stress buffering elements.

22. The method of claim 11, wherein providing electrically conductive stress buffering elements includes thermomechanically isolating the stress buffering elements from one another.

* * * * *